United States Patent
Ang et al.

(10) Patent No.: US 8,456,941 B2
(45) Date of Patent: *Jun. 4, 2013

(54) TABLE LOOKUP VOLTAGE COMPENSATION FOR MEMORY CELLS

(75) Inventors: Boon-Aik Ang, Santa Clara, CA (US); Derric J. H. Lewis, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/481,582

(22) Filed: May 25, 2012

(65) Prior Publication Data

US 2012/0230142 A1    Sep. 13, 2012

Related U.S. Application Data

(63) Continuation of application No. 13/107,724, filed on May 13, 2011, now Pat. No. 8,189,421, which is a continuation of application No. 12/710,153, filed on Feb. 22, 2010, now Pat. No. 7,965,574, which is a continuation of application No. 12/006,744, filed on Jan. 4, 2008, now Pat. No. 7,675,805.

(51) Int. Cl.
*G11C 7/00* (2006.01)

(52) U.S. Cl.
USPC .......................................... 365/226; 365/205

(58) Field of Classification Search
USPC ................................. 365/226, 205
See application file for complete search history.

(56) References Cited

U.S. PATENT DOCUMENTS

| | | |
|---|---|---|
| 5,774,346 A | 6/1998 | Poon et al. |
| 5,815,430 A | 9/1998 | Verhaeghe et al. |
| 6,381,670 B1 | 4/2002 | Lee et al. |
| 6,629,191 B1 | 9/2003 | Katayama et al. |
| 6,667,769 B2 | 12/2003 | Harton et al. |
| 6,728,146 B1 | 4/2004 | Li et al. |
| 7,532,518 B2 * | 5/2009 | Yang et al. ............... 365/185.23 |
| 8,189,421 B2 | 5/2012 | Ang et al. |
| 2003/0003510 A1 | 1/2003 | Bray |
| 2003/0107666 A1 | 6/2003 | Harton et al. |
| 2003/0117827 A1 | 6/2003 | Nishizaka et al. |
| 2003/0210211 A1 | 11/2003 | Moon |
| 2004/0061380 A1 | 4/2004 | Hann et al. |
| 2004/0189565 A1 | 9/2004 | Someya |
| 2007/0200513 A1 | 8/2007 | Ha et al. |
| 2008/0068404 A1 | 3/2008 | Ishii |

FOREIGN PATENT DOCUMENTS

| | | |
|---|---|---|
| WO | WO 2006-107730 A1 | 10/2006 |
| WO | WO 2007-080586 A2 | 7/2007 |

* cited by examiner

*Primary Examiner* — Michael Tran

(57) ABSTRACT

Systems and methods of regulating voltage at a memory cell are disclosed. An address for the memory cell is determined. Table lookups based on the address are performed. The table lookups yield voltage compensation parameters that can be used to set voltages on the terminals (e.g., source and drain) of the memory cell.

20 Claims, 4 Drawing Sheets

TABLE LOOKUP VOLTAGE COMPENSATION FOR MEMORY CELLS

RELATED UNITED STATES PATENT APPLICATIONS

This application is a continuation application of the U.S. patent application with Ser. No. 13/107,724, filed May 13, 2011, by Boon-Aik Ang et al., and entitled "Table Lookup Voltage Compensation for Memory Cells," now U.S. Pat. No. 8,189,421, which in turn is a continuation application of the U.S. patent application with Ser. No. 12/710,153, filed Feb. 22, 2010, by Boon-Aik Ang et al., and entitled "Table Lookup Voltage Compensation for Memory Cells," now U.S. Pat. No. 7,965,574, which in turn is a continuation application of the U.S. patent application with Ser. No. 12/006,744, filed Jan. 4, 2008, by Boon-Aik Ang et al., and entitled "Table Lookup Voltage Compensation for Memory Cells," now U.S. Pat. No. 7,675,805, all of which are hereby incorporated by reference in their entirety.

TECHNICAL FIELD

Embodiments in accordance with the present invention generally relate to semiconductor devices such as flash memory cells.

BACKGROUND

Dual-bit flash memory cells, which allow the storage of two bits of information in a single memory cell, are becoming quite common. A dual-bit memory cell is generally symmetrical. One bit of information is stored as a level of electrical charge on one side (e.g., the "left side") of a charge storage element (e.g., the gate structure), and another bit of information is similarly stored on the other side (e.g., the "right side") of the charge storage element. Each side of the charge storage element can be programmed and erased independently of the other side, and the drain and source are interchangeable. That is, the left-side junction can serve as the source terminal for the left-side bit of information and as the drain terminal for the right-side bit of information, and the right-side junction can serve as the source terminal for the right-side bit of information and as the drain terminal for the left-side bit of information.

The memory cells are typically arrayed in rows and columns. All the cells in a row have their gate structures connected to the same word line. All the cells in a column have their left-side junctions connected to one bit line, and their right-side junctions connected to another bit line. During programming of a memory cell, a source bias voltage VS is applied to the bit line connected to the side of the memory cell that is serving as the source terminal, and a drain bias voltage VD is applied to the bit line connected to the other side of the memory cell.

Programming a dual-bit flash memory cell is facilitated if the drain and source sides of the cell are set to known voltages. The goal is to attain a relatively constant voltage difference VDS (VDS=VD−VS), resulting in relatively constant programming speed for all sectors in the memory array. However, some sort of voltage compensation is generally necessary because various voltage drops are present along the path from the voltage generator (e.g., a high voltage source) to the drain and source sides of a cell. "VDS compensation" refers to the adjustments of the drain and source voltages to account for any such voltage drops, so that the voltage across the cell remains relatively constant during programming.

A drain-side voltage regulator and a source-side voltage regulator can be used to adjust VD and VS, respectively. Conventionally, the voltage regulators are designed with specific capacitor ratios implemented in hardware. The capacitor ratios dictate the voltage compensation parameters applied to the various cells in the memory array.

SUMMARY

A conventional VDS compensation system includes a voltage regulator with an adjustable capacitor ratio network. These capacitor ratios are usually hardwired to certain memory cell addresses to perform the desired VDS compensation. Typically, the voltage compensation parameters are determined only after thorough silicon characterization. To change voltage compensation parameters in a conventional system, the capacitor ratios in the voltage regulators would need to be changed. Most likely, this would require changes to the mask layers applied during fabrication, and thus conventional voltage regulators do not provide much flexibility for changing compensation parameters after tape-out. Disclosed herein are systems and methods for regulating voltage at a memory cell that overcome such a problem.

According to an embodiment of the present invention, an address for the memory cell is determined. Table lookups based on the address are performed. The table lookups yield voltage compensation parameters that can be used to set voltages on the terminals (e.g., source and drain) of the memory cell. Thus, the conventional system of hardwired capacitor ratio-to-address is decoupled and a new layer of mapping is added. The mapping takes the form of a table lookup where the memory address is used to index an entry in a lookup table.

More specifically, in one embodiment, a microcontroller determines the location of a memory cell and uses that location to index voltage compensation parameters that are stored in one or more lookup tables. The voltage compensation parameters are added to the source voltage, yielding adjusted (compensated) source and drain voltage values that, when applied to the terminals of the memory cell, result in a relatively constant voltage across the memory cell during programming. The adjusted drain and source voltage values are each encoded by the microcontroller, and the encoded values are sent to the drain and source voltage regulators, respectively, which apply the compensated voltage values to the memory cell's terminals. Because the microcontroller performs the calculations needed to determine the compensated voltage values and thus may send only the encoded results to the voltage regulators, the voltage regulators can be implemented using digital-to-analog converters.

In summary, voltage compensation parameters are implemented in software using table lookups rather than in hardware using capacitor ratio-address pairs. Owing to the computational power of the microcontroller, the software approach can be implemented efficiently. Also, using the software approach, new voltage compensation parameters can be readily incorporated into the lookup tables. In contrast, changing preset capacitor ratio-address pairs in hardware is difficult, particularly after tape-out and fabrication. Thus, a software approach allows voltage compensation parameters to be updated more quickly and with greater flexibility relative to a hardware approach.

These and other objects of the various embodiments of the present invention and their advantages will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Figure 1:
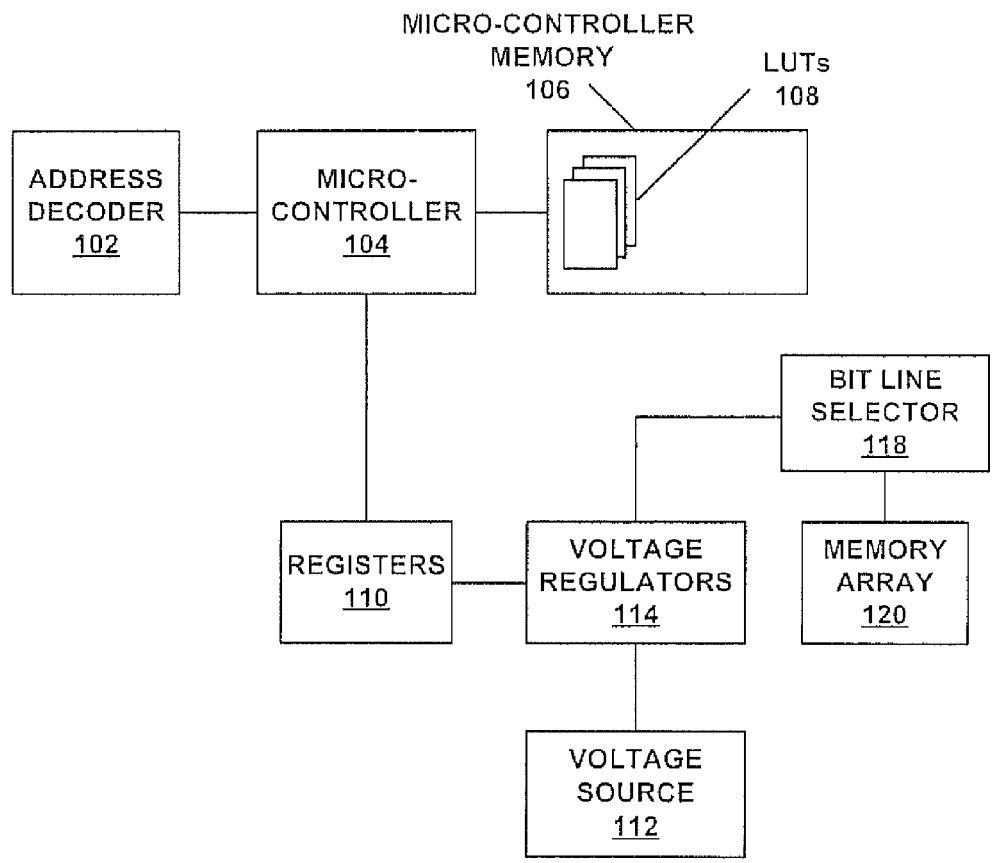
FIG. 1 is a block diagram of a voltage compensation system according to one embodiment of the present invention.

The drawings referred to in this description should be understood as not being drawn to scale except if specifically noted.

DETAILED DESCRIPTION

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "identifying" or "adjusting" or "performing" or "setting" or "combining" or "encoding" or "inputting" or "selecting" or "updating" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of computer-executable instructions or components residing on some form of computer-usable medium, such as program modules, executed by one or more computers or other devices. Generally, program modules include routines, programs, objects, data structures, etc., that perform particular tasks or implement particular abstract data types. The functionality of the program modules may be combined or distributed as desired in various embodiments. By way of example, and not limitation, computer-usable media includes volatile and nonvolatile, removable and non-removable media implemented in any method or technology for storage of information such as computer-readable instructions, data structures, program modules or other data.

FIG. 1 is a block diagram showing selected elements in a system 100 that includes components used to regulate voltage at the sources and drains of flash memory cells in a memory array 120. In one embodiment, the flash memory cells are dual-bit memory cells. However, embodiments in accordance with the present invention are not so limited. That is, features of the present invention can be utilized with single-bit memory cells as well as memory cells capable of storing more than two bits of information per cell.

In the example of FIG. 1, system 100 also includes a microcontroller (MCU) 104 and a memory 106. Memory 106 is accessible to the MCU 104 and may be internal to the MCU. System 100 also includes a high (e.g., five volt) voltage source 112 and voltage regulators 114. The voltage regulators 114 include a drain-side regulator and a source-side regulator for controlling or regulating the drain bias voltage VD and the source bias voltage VS, respectively.

Memory 106 includes trim values in general, and a number of lookup tables (LUTs) 108 in particular. As described previously herein, programming a dual-bit flash memory cell is facilitated if the drain and source sides of the cell are set to known voltages. The goal is to attain a relatively constant voltage difference VDS (VDS=VD−VS), resulting in relatively constant programming speed for all sectors in the memory array. However, some sort of voltage compensation is generally necessary because the path from the voltage generator to the drain and source sides of a cell contains various voltage drops. According to embodiments of the present invention, the LUTs 108 include VDS compensation parameters that, when applied to the drain and source of a memory cell in the manner described below, account for those voltage drops.

In the example of FIG. 1, address decoder 102 decodes a backend address that, in essence, identifies a particular memory cell in the array 120. The MCU 104 analyzes the decoded address, and maps the decoded address to the LUTs 108 in order to select VDS compensation parameters that correspond to the backend address/memory cell.

In one embodiment, one set of VDS compensation parameters are defined for drain-side compensation and another set of VDS compensation parameters are defined for source-side compensation. In one such embodiment, within the set of drain-side parameters and within the set of source-side parameters, VDS compensation parameters are defined as a function of "x" and "y." That is, the VDS compensation parameters for a memory cell depend on the location, in two dimensions, of the memory cell within array 120 (e.g., the x-direction or horizontal position of the memory cell, and the y-direction or vertical position of the memory cell).

Figure 2:
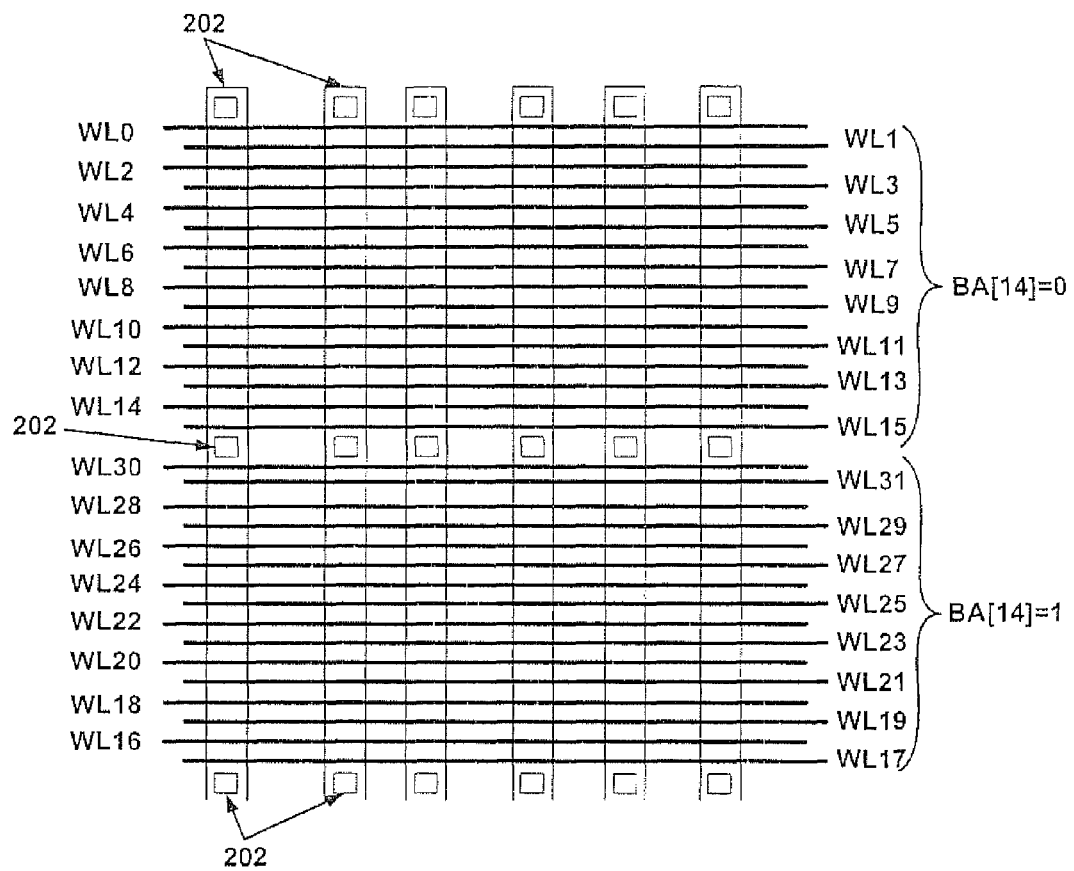
FIG. 2 illustrates a portion of a memory array according to one embodiment of the present invention.

As discussed further in conjunction with FIG. 2, in one embodiment of a dual-bit memory cell architecture, there are electrical contacts located every 16 word lines, and a buried diffusion bit line is used to connect the contacts and to access a memory cell. As a consequence, there is a voltage drop across the buried diffusion bit line that needs to be accounted for in the VDS compensation calculations. Accordingly, in one embodiment, within the set of drain-side parameters, VDS compensation parameters are defined for diffusion bit line compensation (DBL compensation). DBL compensation is a function of the distance between the memory cell of interest and the nearest electrical contact.

Thus, in one embodiment, the LUTs 108 of FIG. 1 include at least five LUTs, as follows:

a first LUT that contains drain-side VDS compensation parameters as a function of a first dimension (e.g., x-direction)—each of these parameters is referred to herein as an index-1D;

a second LUT that contains drain-side VDS compensation parameters as a function of a second dimension (e.g., y-direction)—each of these parameters is referred to herein as an index-2D;

a third LUT that contains VDS compensation parameters for drain-side DBL compensation—each of these parameters is referred to herein as an index-3D;

a fourth LUT that contains source-side VDS compensation parameters as a function of the first dimension—each of these parameters is referred to herein as an index-1S; and a fifth LUT that contains source-side VDS compensation parameters as a function of the second dimension—each of these parameters is referred to herein as an index-2S.

The VDS compensation parameters in the LUTs 108 can be determined in any number of ways. For example, target values of VD and VS can be prescribed by design, and baseline or original voltages $VPROG_{orig}$ (on the drain side) and $GARVSS_{orig}$ (on the source side) can also be prescribed by design. VDS compensation parameters can then be determined considering the various voltage drops that occur between the point at which the values of $VPROG_{orig}$ and $GARVSS_{orig}$ are measured and the source and drain of the memory cell of interest. Methods for determining VDS compensation parameters are known in the art.

With table lookups, there is no constraint that VDS compensation parameters be linear. The VDS compensation parameters can be either linear or non-linear when measured from, for example, one sector to another sector.

In one embodiment, the VDS compensation parameters are selected according to which sector of array 120 is identified by the backend address. In one such embodiment, the same VDS compensation parameters are applied to all memory cells (all addresses) within a particular sector or group of sectors. In one implementation, the memory array is partitioned into "sector groups" every two banks (each bank including eight sectors) in the x-direction and every four sectors in the y-direction, with the same VDS compensation parameters being applied within each sector group. However, embodiments in accordance with the present invention are not limited to sector-based VDS compensation parameters. In general, the portion of array 120 (e.g., the range of addresses) that is mapped to each individual entry in an LUT is a design-specific detail and may encompass any number of sectors or memory cells, including a single cell. In other words, VDS compensation parameters may be determined and applied cell-by-cell, sector-by-sector, sector group-by-sector group, or device-by-device, for example.

Embodiments in accordance with the present invention may be implemented using more or less than five LUTs. For example, the first and second LUTs mentioned above may be combined into a single LUT, with one axis of the combined LUT corresponding to the first dimension of array 120, and the other axis of the combined LUT corresponding to the second dimension of the array. In such a combined LUT, the VDS compensation parameter at the intersection of a column and row of the LUT would be the sum of the appropriate VDS compensation parameters (e.g., the sum of index-1S and index-2S, or the sum of index-1D and index-2D). On the other hand, if the portion of array 120 that is mapped to each individual LUT entry is relatively small, the use of more than five LUTs may prove more efficient.

Furthermore, the LUTs 108 can include a set of LUTs for programming and another set of LUTs for soft programming—for example, there may be five LUTs such as those described above for programming, and five similar LUTs for soft programming. "Soft programming" is a term of art, and refers to a process adopted as a means to correct over-erased cells. More specifically, some memory cells may become over-erased, resulting in an excessively low threshold voltage and correspondingly high drain current leakage, which may cause problems in subsequent read, verify or erase operations. Soft programming involves applying one or more program pulses to over-erased cells, which raises the threshold voltages of those cells.

Moreover, the LUTs 108 can include LUTs that take into account and compensate for effects other than voltage drops that might influence VDS. For example, VDS compensation parameters that account for the effects of ambient temperature can be determined. Thus, there may be five LUTs such as those described above for one range of temperatures, another five similar LUTs for another range of temperatures, and so on.

In operation, system 100 functions as follows. For drain-side voltage compensation, the decoded address from address decoder 102 is analyzed by MCU 104. The MCU 104 then maps the address to the LUTs 108, as mentioned above. If there are multiple sets of LUTs (e.g., a set for programming, a set for soft programming, etc.), then the MCU 104 selects the appropriate set of LUTs. Based on the decoded address, the MCU 104 selects a first parameter (e.g., an index-1D) and a second parameter (e.g., an index-2D) from the LUTs 108. The MCU 104 also determines the location of the word line that corresponds to the decoded address, and selects a third parameter (an index-3D) from the LUTs 108. These three indices are then arithmetically summed by the MCU 104 to get a total compensation value. The total compensation value is then added to the original (uncompensated) voltage value $VPROG_{orig}$ to get a compensated voltage value $VPROG_{comp}$.

The compensated voltage value is then transmitted to the drain voltage regulator 114, which applies the compensated voltage value to the drain of the appropriate memory cell via bit line selector/control logic 118 in a known manner.

In one embodiment, MCU 104 encodes the drain-side compensated voltage value as an N-bit string that is written to one of the registers 110. Accordingly, the drain voltage regulator 104 can be implemented as a simple, generic ("off-the-shelf") digital-to-analog converter. In one embodiment, the drain-side compensated voltage value $VPROG_{comp}$ is encoded as a nine-bit string. In general, the resolution of the compensated voltage value depends on the number of encoding bits.

For source-side voltage compensation, a similar approach is used. MCU 104 maps the decoded address to the LUTs 108, as described above. Based on the decoded address, the MCU 104 selects a fourth parameter (e.g., an index-1S) and a fifth parameter (e.g., an index-2S) from the LUTs 108. These two indices are then arithmetically summed by the MCU 104 to get a total compensation value for the source side. The source-side total compensation value is then added to the original (uncompensated) voltage value $GARVSS_{orig}$ to get a source-side compensated voltage value $GARVSS_{comp}$, which is then transmitted to the source voltage regulator 114 and applied to the source of the appropriate memory cell via bit line selector/control logic 118 in a known manner. In one embodiment, MCU 104 encodes the source-side compensated voltage value as an M-bit string that is written to one of the registers 110. Accordingly, the source voltage regulator 104 can also be implemented as an off-the-shelf digital-to-analog converter. The number of bits used to encode the source-side compensated voltage value may be different from the number of bits used to encode the drain-side compensated voltage value. In one embodiment, the source-side compensated voltage value $GARVSS_{comp}$ is encoded as a four-bit string.

FIG. 2 illustrates a portion of memory array 120 according to one embodiment of the present invention. In the example of FIG. 2, there are 16 word lines (WLs) between each row of DBL electrical contacts 202. However, according to convention, the electrical arrangement of the word lines does not coincide with the physical arrangement of the word lines, and hence the electrical arrangement has to be mapped to the physical arrangement. To elaborate, the first 16 electrical word lines are arranged in ascending order from WL0 to WL15 and map directly to the first 16 physical word lines. However, the next 16 electrical word lines are arranged non-consecutively although almost in descending order: WL30, WL31, WL28, WL 29, etc. This pattern is repeated every 32 word lines. The latter group of 16 electrical word lines is mapped to the physical word lines in ascending order from WL16 to WL31. For example, electrical word line WL30 is mapped to physical word line WL16, electrical word line WL31 is mapped to physical word line WL17, and so on.

In the present embodiment, DBL compensation (index-3D) is based on the physical word line, but the address received by MCU 104 (FIG. 1) is based on the electrical word line. However, because of the computational power of the MCU, the mapping of electrical word line to physical word line is readily accomplished.

MCU 104 can perform the mapping by analyzing the backend address (BA) and then proceeding accordingly. With reference to FIG. 2, in the group of word lines WL0 to WL15, the word lines closest to an electrical contact are WL0 and WL15, and in the group of word lines WL16 to WL31, the word lines closest to an electrical contact are WL17 and WL30. In order to select the correct DBL compensation parameter, the backend address may be preprocessed prior to selection of a value for index-3D. In one embodiment, MCU 104 first checks the value of bit BA[14] in the backend address. If BA[14] is high (equal to 1), then the backend address is preprocessed—for example, an exclusive OR function of BA[12]_BA[10:9] is performed using a constant of "001" for BA[12] and BA[10:9]. If BA[14] is low (equal to 0), then the electrical word line is mapped directly to the physical word line, and there is no preprocessing of the backend address.

Figure 3:
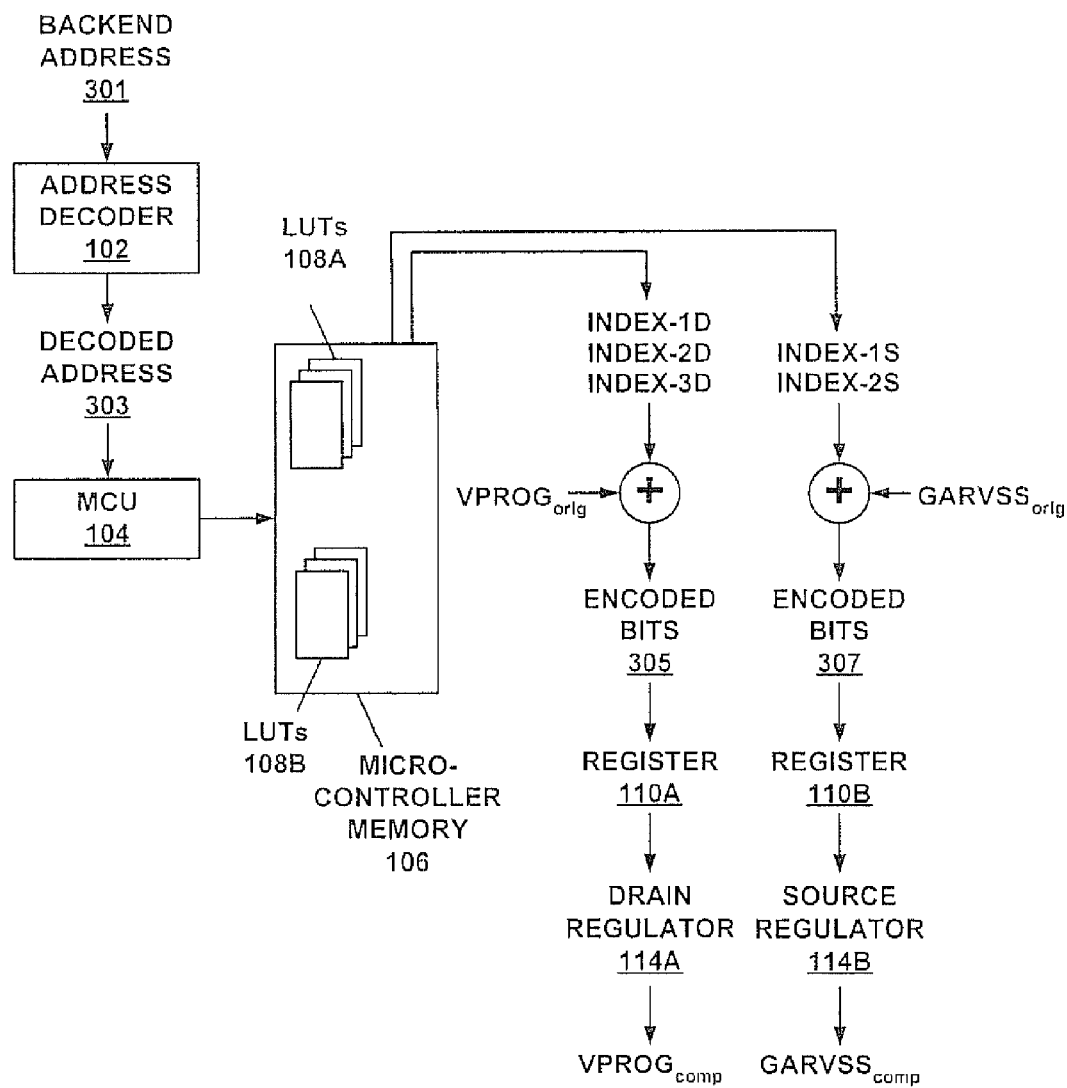
FIG. 3 illustrates information flow in a voltage compensation system according to one embodiment of the present invention.
Figure 4:
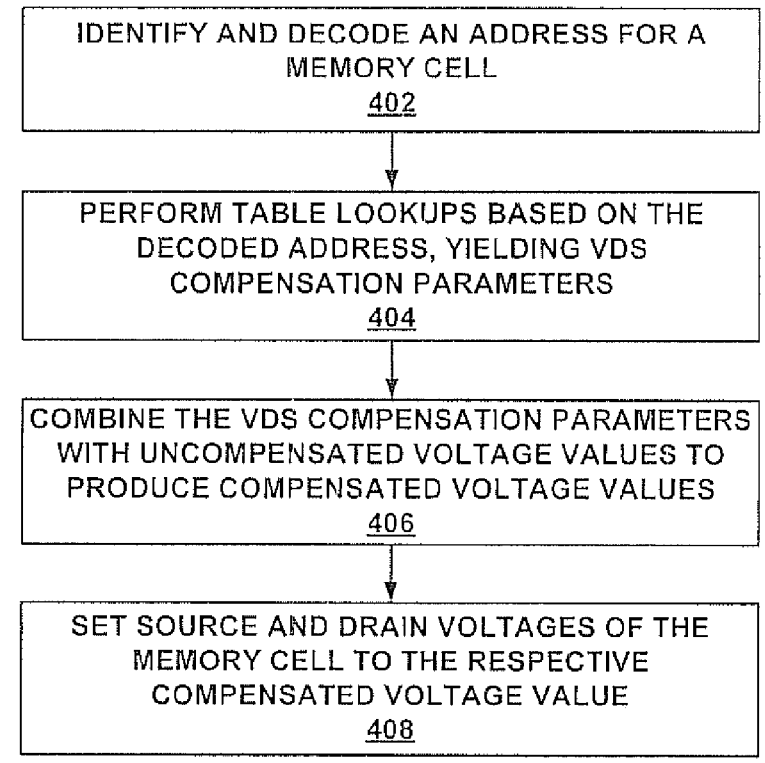
FIG. 4 is a flowchart of a method for regulating voltage at a memory cell according to one embodiment of the present invention.

FIG. 3 illustrates information flow in a voltage compensation system according to one embodiment of the present invention. FIG. 4 is a flowchart 400 of a method for regulating voltage at a memory cell according to one embodiment of the present invention. Flowchart 400 is discussed in conjunction with FIG. 3.

In block 402, an address that is associated with a memory cell is identified. More specifically, address decoder 102 decodes a backend address 301 and provides a decoded address 303 to MCU 104.

In block 404, table lookups are performed using the decoded address, in order to select information that can be used to determine a compensated voltage value for each terminal (drain and source) of the memory cell. More specifically, MCU 104 analyzes the decoded address and maps the decoded address to one of the LUTs 108A/108B. In one embodiment, MCU 104 selects one set of LUTs (e.g., LUTs 108A) if the memory cell is being soft programmed; otherwise, MCU 104 selects another set of LUTs (e.g., LUTs 108B). Within the LUTs 108A, and also within the LUTs 108B, there is at least one LUT for drain-side VDS compensation and at least one LUT for source-side VDS compensation. In one embodiment, within the LUTs 108A, and also within the LUTs 108B, there is also an LUT for DBL compensation. As noted above, there may be additional LUTs to account for effects other than voltage drops.

In block 404, for drain-side voltage compensation, a first table lookup yields a first VDS compensation parameter (e.g., index-1D), a second table lookup yields a second VDS compensation parameter (e.g., index-2D), and a third table lookup yields a third VDS compensation parameter (e.g., index-3D). For source-side voltage compensation, a first table lookup yields a first VDS compensation parameter (e.g., index-1S), and a second table lookup yields a second VDS compensation parameter (e.g., index-2S).

In block 406, the VDS compensation parameters of block 404 are selectively combined to produce voltage compensation values for the source side and for the drain side. More specifically, for the drain side, MCU 104 adds indices-1D, 2D and 3D to the uncompensated (original) voltage value $VPROG_{orig}$ to produce a compensated voltage value $VPROG_{comp}$. Similarly, for the source side, MCU 104 adds indices-1S and 2S to the uncompensated (original) voltage value $GARVSS_{orig}$ to produce a compensated voltage value $GARVSS_{comp}$.

In block 408, the voltages at the drain and source of the memory cell are set to the compensated voltage values $VPROG_{comp}$ and $GARVSS_{comp}$, respectively. More specifically, in one embodiment, MCU 104 encodes $VPROG_{comp}$ as a first set of encoded bits 305, and encodes $GARVSS_{comp}$ as a second set of encoded bits 307. In one such embodiment, encoded bits 305 are placed into register 110A and encoded bits 307 are placed into register 110B. As described previously herein, in one embodiment, drain voltage regulator 114A and source voltage regulator 114B are digital-to-analog converters. Based on encoded bits 305, drain voltage regulator 114A applies $VPROG_{comp}$ to the drain of the memory cell, and based on encoded bits 307, source voltage regulator 114B applies $GARVSS_{comp}$ to the source of the memory cell.

Although specific steps are disclosed in flowchart 400, such steps are exemplary. That is, the present invention is well suited to performing variations of the steps recited in flowchart 400. It is also appreciated that other processes and steps associated with voltage regulation and compensation may be performed along with the process illustrated by FIG. 4; that is, there may be a number of process steps before, during and after the steps shown and described by FIG. 4.

In summary, voltage (VDS) compensation parameters are implemented in software using table lookups rather than in hardware using capacitor ratio-address pairs. Owing to the computational power of the microcontroller, the software approach can be implemented efficiently. Also, lookup tables can be readily changed (e.g., reprogrammed with new parameters), which allows voltage compensation parameters to be updated more quickly and with greater flexibility relative to a hardware approach. Updates can be made at any time and can even be made remotely. Furthermore, by relying on the intelligence and computational power of the microcontroller, the voltage regulators can be implemented as simple digital-to-analog converters. Because computation tasks are not being performed by the voltage regulators, the regulator interface is greatly simplified and can be made more modular across different architectures and platforms.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A computer-implemented voltage compensation method, said method comprising:
   selecting a first voltage compensation parameter from a first lookup table (LUT) using a two-dimensional address of a memory cell in an array of memory cells, wherein one axis of said first LUT corresponds to a first dimension of said two-dimensional address and another axis of said first LUT corresponds to a second dimension of said two-dimensional address, and wherein said first voltage compensation parameter comprises the sum of a voltage compensation parameter that is a function of said first dimension and a voltage compensation parameter that is a function of said second dimension;
   combining said first voltage compensation parameter and an uncompensated voltage value to determine a compensated voltage value; and
   setting a voltage at a terminal of said memory cell to said compensated voltage value.

2. The method of claim 1 wherein said terminal comprises a region selected from the group consisting of: a source region of said memory cell; a drain region of said memory cell.

3. The method of claim 1 further comprising selecting a second voltage compensation parameter from a second LUT using said two-dimensional address, said second voltage compensation parameter a function of distance between said memory cell and an electrical contact closest to said memory cell, and wherein said second voltage compensation parameter is combined with said first compensation parameter and said uncompensated voltage value to determine said compensated voltage value.

4. The method of claim 3 wherein said terminal comprises a drain region of said memory cell.

5. The method of claim 1 further comprising encoding said compensated voltage value as a bit string.

6. The method of claim 5 further comprising inputting said bit string to a voltage regulator that sets said voltage at said terminal to said compensated voltage value.

7. The method of claim 1 further comprising selecting said first LUT from a first set of LUTs if said memory cell is soft programmed, wherein otherwise said first LUT is selected from a second set of LUTs.

8. The method of claim 1 further comprising updating entries in said first LUT such that values of said entries are replaced with different values.

9. A system comprising:
   an array of memory cells; and
   a microcontroller coupled to said memory cells and operable for selecting a first voltage compensation parameter from a first lookup table (LUT) using a two-dimensional address of a memory cell in said array of memory cells, wherein one axis of said first LUT corresponds to a first dimension of said two-dimensional address and another axis of said first LUT corresponds to a second dimension of said two-dimensional address, and wherein said first voltage compensation parameter comprises the sum of a voltage compensation parameter that is a function of said first dimension and a voltage compensation parameter that is a function of said second dimension, said microcontroller further operable for combining said first voltage compensation parameter and an uncompensated voltage value to determine a compensated voltage value; and wherein a compensated voltage value that is based on said first voltage compensation value is applied to a terminal of said memory cell.

10. The system of claim 9 wherein said terminal comprises a region selected from the group consisting of: a source region of said memory cell; a drain region of said memory cell.

11. The system of claim 9 wherein said microcontroller is further operable for selecting a second voltage compensation parameter from a second LUT using said two-dimensional address, said second voltage compensation parameter a function of distance between said memory cell and an electrical contact closest to said memory cell, and wherein said second voltage compensation parameter is combined with said first compensation parameter and said uncompensated voltage value to determine said compensated voltage value.

12. The system of claim 11 wherein said terminal comprises a drain region of said memory cell.

13. The system of claim 9 wherein said microcontroller is operable for encoding said compensated voltage value as a bit string.

14. The system of claim 13 further comprising a voltage regulator that receives said bit string, wherein said voltage regulator comprises a digital-to-analog converter that supplies said compensated voltage value to said terminal.

15. The system of claim 9 wherein said first LUT is selected from a first plurality of LUTs if said memory cell is soft programmed, wherein otherwise said first LUT is selected from a second plurality of LUTs.

16. A computer-readable medium having stored thereon, computer-executable instructions that, responsive to execution by a computing device, cause the computing device to perform operations comprising:
   selecting a first voltage compensation parameter from a first lookup table (LUT) using a two-dimensional address of a memory cell in an array of memory cells, wherein one axis of said first LUT corresponds to a first dimension of said two-dimensional address and another axis of said first LUT corresponds to a second dimension of said two-dimensional address, and wherein said first voltage compensation parameter comprises the sum of a voltage compensation parameter that is a function of said first dimension and a voltage compensation parameter that is a function of said second dimension;

combining said first voltage compensation parameter and an uncompensated voltage value to determine a compensated voltage value; and setting a voltage at a terminal of said memory cell to said compensated voltage value.

17. The computer-readable medium of claim 16 wherein said operations further comprise selecting a second voltage compensation parameter from a second LUT using said two-dimensional address, said second voltage compensation parameter a function of distance between said memory cell and an electrical contact closest to said memory cell, and wherein said second voltage compensation parameter is combined with said first compensation parameter and said uncompensated voltage value to determine said compensated voltage value.

18. The computer-readable medium of claim 17 wherein said operations further comprise updating entries in said first and second LUTs such that values of said entries are replaced with different values.

19. The computer-readable medium of claim 16 wherein said operations further comprise:

encoding said compensated voltage value as a bit string; and inputting said bit string to a voltage regulator that sets said voltage at said terminal to said compensated voltage value.

20. The computer-readable medium of claim 16 wherein said terminal comprises a region selected from the group consisting of: a source region of said memory cell; a drain region of said memory cell.

\* \* \* \* \*